United States Patent [19]

Matsuo et al.

[11] Patent Number: 4,853,605
[45] Date of Patent: Aug. 1, 1989

[54] LOAD STATE DETECTING APPARATUS OF AN INDUCTION MOTOR FOR CONTROLLING THE SPIN DRYER OF A WASHING MACHINE

[75] Inventors: Katsuharu Matsuo, Aichi; Yoshiyuki Azuma, Seto, both of Japan

[73] Assignee: Kabushiki Kaisha Toshiba, Kawasaki, Japan

[21] Appl. No.: 201,265

[22] Filed: Jun. 2, 1988

Related U.S. Application Data

[63] Continuation of Ser. No. 129,865, Dec. 4, 1987, abandoned, which is a continuation of Ser. No. 810,228, Dec. 17, 1985, abandoned.

[30] Foreign Application Priority Data

Dec. 18, 1984 [JP] Japan .............................. 59-266894
Feb. 18, 1985 [JP] Japan ................................ 60-29938
Feb. 25, 1985 [JP] Japan ................................ 60-36022

[51] Int. Cl.⁴ .................................................. H02P 5/40
[52] U.S. Cl. ..................................... 318/729; 318/798; 361/30; 68/12 R
[58] Field of Search ................... 318/729, 798, 806; 68/12 R; 361/30, 79

[56] References Cited

U.S. PATENT DOCUMENTS

| | | | |
|---|---|---|---|
| 3,600,657 | 8/1971 | Pfaff | 361/30 |
| 4,117,408 | 9/1978 | Comstedt | 318/805 |
| 4,150,303 | 4/1979 | Armstrong | 68/12 R |
| 4,194,145 | 3/1980 | Ritter | 318/799 |
| 4,266,177 | 5/1981 | Nola | 318/810 |
| 4,280,038 | 7/1981 | Havas et al. | 363/97 |
| 4,335,592 | 6/1982 | Torita | 68/12 R |
| 4,388,578 | 6/1983 | Green et al. | 318/729 |
| 4,481,786 | 11/1984 | Bashark | 68/12 R |

FOREIGN PATENT DOCUMENTS

| | | | |
|---|---|---|---|
| 79228 | 12/1981 | Australia . | |
| 543097 | 11/1955 | Belgium | 361/30 |
| 2823201 | 11/1979 | Fed. Rep. of Germany | 361/30 |
| 1494202 | 12/1977 | United Kingdom . | |
| 2128425 | 4/1984 | United Kingdom . | |

*Primary Examiner*—David Smith, Jr.
*Attorney, Agent, or Firm*—Cushman, Darby & Cushman

[57] ABSTRACT

A load state detecting apparatus of an induction motor having two coils, the apparatus having a drive voltage supplying unit for supplying a drive voltage to the coils in the induction motor, a phase difference detecting unit for detecting a phase difference between the drive voltage supplied across the coils of the induction motor and a current flowing through one of the coils upon application of the drive voltage and for generating a phase difference signal, and a load state detecting unit for comparing the phase difference signal generated by the phase difference detecting unit with a predetermined reference value and generating a signal depending on a load state of the induction motor.

8 Claims, 12 Drawing Sheets

F I G. 14A
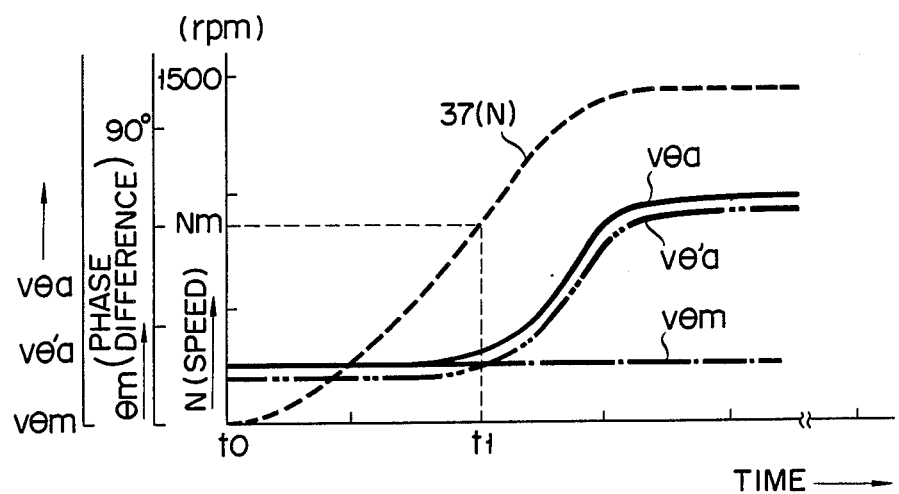
F I G. 14B
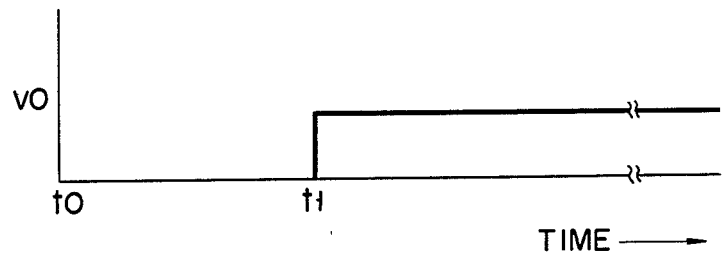

LOAD STATE DETECTING APPARATUS OF AN INDUCTION MOTOR FOR CONTROLLING THE SPIN DRYER OF A WASHING MACHINE

This is a continuation of application Ser. No. 129,865, filed Dec. 4, 1987, now abandoned, which is a continuation of Ser. No. 810,228, filed Dec. 17, 1985, now abandoned.

BACKGROUND OF THE INVENTION

This invention relates to a load state detecting apparatus of an induction motor and, more particularly, to a load state detecting apparatus for detecting a load state in an induction motor in accordance with information representing a phase difference between a voltage applied from an alternative power source to the induction motor and a current induced therefrom. The apparatus can be used, for example, as an operation stop control apparatus for controlling interruption of the spin dyring in a washing machine.

The operating duration of an induction motor for driving the bucket in a washing machine during the spin drying is determined by the user, who predicts spin cycle end time in accordance with the amount and type of washing to be done. The user then sets a timer in accordance with the predicted duration. It is, however, difficult to accurately predict the spin drying end time. Inevitably, the user sets a longer time than is necessary. Therefore, operating time is prolonged and power consumption is increased.

For this reason, several techniques have been proposed to automatically set the spin drying time by detecting the load state of the induction motor.

One such technique is to detect induction motor speed. For this purpose, an arrangement using a rotor such as a tachometer is utilized, in which the mechanical movement of the tachometer is converted into an electrical signal. However, this arrangement takes up considerable space and has a short lifetime since mechanically driven members are used. Another conventional technique for detecting the load state of the induction motor uses a simple electrical means for detecting input current to the induction motor. However, the input current varies with external conditions such as power source voltage variations and temperature variations in the induction motor, thus reducing measurement precision.

Therefore, the operation stop control apparatus for controlling spin drying interruption in a washing machine cannot be implemented by simply applying these conventional load state detecting means, since control precision cannot be guaranteed.

SUMMARY OF THE INVENTION

It is, therefor, an object of the present invention to provide a new and improved load state detecting apparatus of an induction motor, which detects a phase difference between a voltage applied to an induction motor and a coil current to derive a signal that specifies the load state of the induction motor with high precision.

According to the present invention, there is provided a load state detecting apparatus of an induction motor having two coils, the apparatus comprising:

drive voltage supplying means for supplying a drive voltage to the coils in the induction motor;

phase difference detecting means for detecting a phase difference between the drive voltage supplied across the coils of the induction motor and a current flowing through one of the coils upon application of the drive voltage, and for generating a phase difference signal; and load state detecting means for comparing the phase difference signal generated by the phase difference detecting means with a predetermined reference value and generating a signal specifying the load state of the induction motor.

BRIEF DESCRIPTION OF THE DRAWINGS

These and other objects and features of the present invention can be understood by reference to the accompanying drawings, in which:

FIGS. 14A and 14B are graphs showing the motor speed and phase detection signal characteristics together with the timing chart of the discrimination signal.

DETAILED DESCRIPTION OF THE PREFERRED EMBODIMENTS

Figure 1:
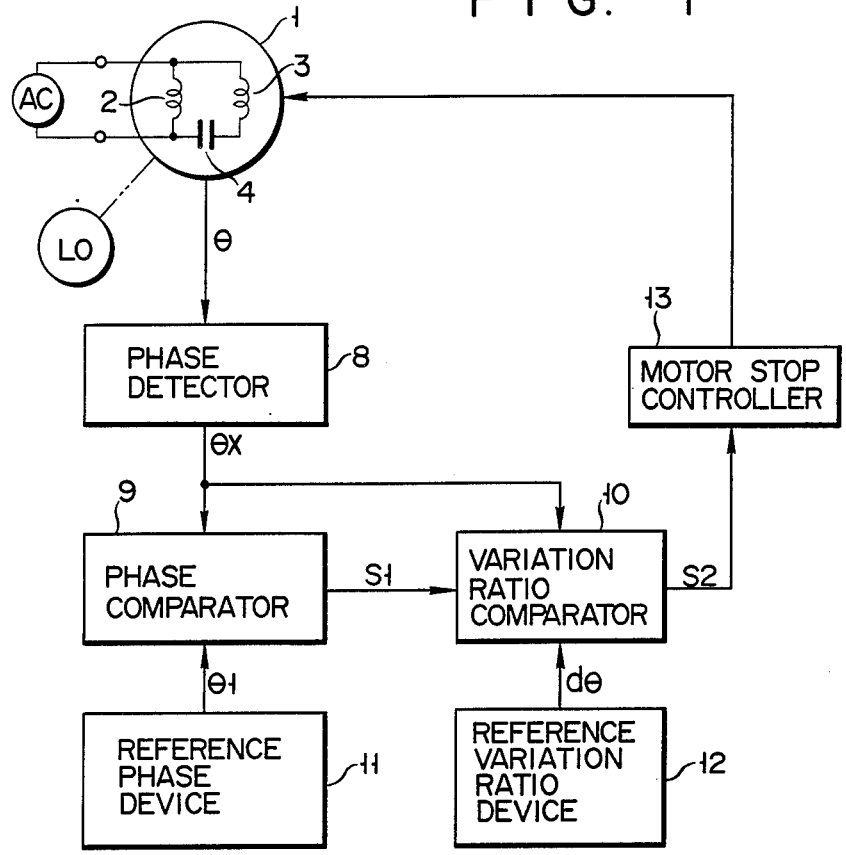
FIG. 1 is a block diagram of an operation circuit according to a first embodiment of the present invention.

Several preferred embodiments of the present invention will be described with reference to the accompanying drawings. In the arrangement of the circuit as a first embodiment of FIG. 1, reference numeral 1 denotes an induction motor for driving a washing/spin drying tank or spinning basket rotatably arranged in a washing machine serving as load LO. Motor 1 is a so-called capacitor motor, having main coil 2, auxiliary coil 3 and capacitor 4.

Figure 2:
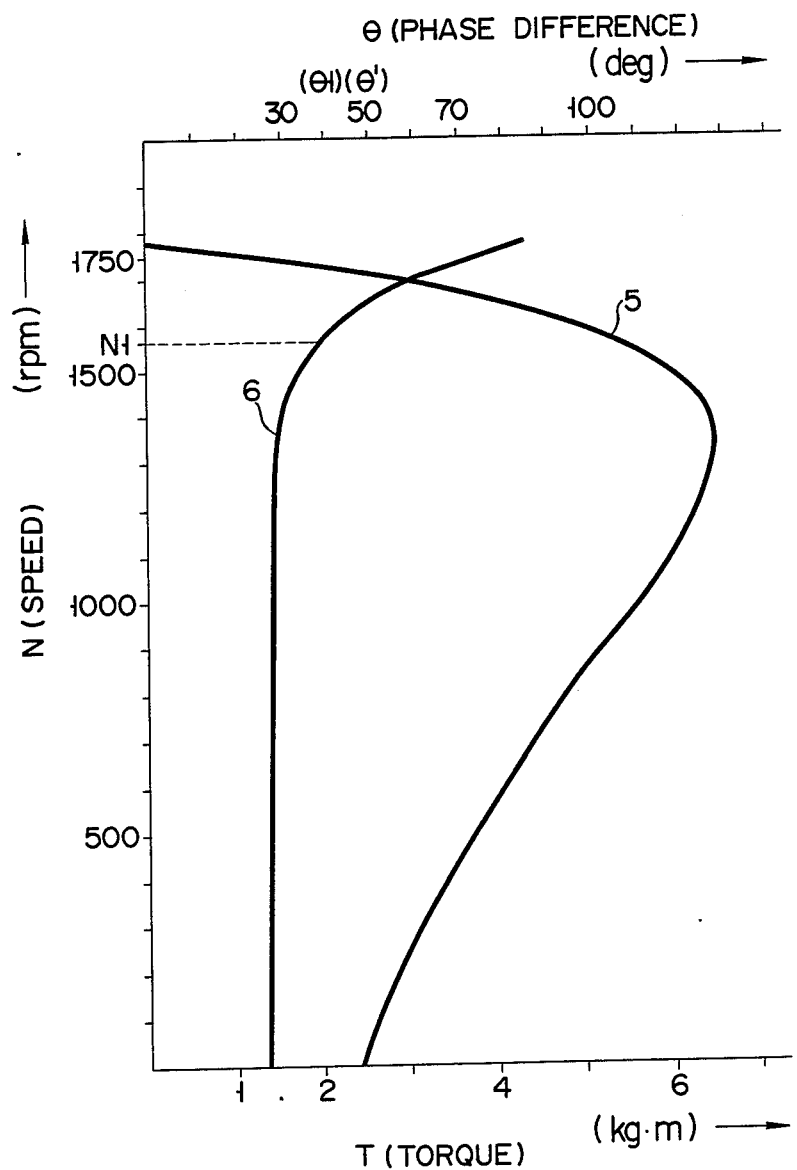
FIG. 2 is a graph showing the relationship between the speed of an induction motor of FIG. 1, its torque, and its phase difference.

FIG. 2 shows as measured results the relationship between revolution speed N, torque T and phase difference $\theta$ of motor 1. Referring to FIG. 2, reference numeral 5 denotes a torque curve; and 6, a phase curve. As indicated by phase curve 6, the difference $\theta$ between the voltage and the current in coil 2 of motor 1 increases upon an increase in speed N of motor 1 when speed N exceeds a given value (BN1) to be described later. Slippage S decreases in response to an increase in motor speed, a characteristic inherent to the induction motor. This is because the secondary reactance determined by the primary reactance at the rotor side in motor 1 is decreased.

Figure 3:
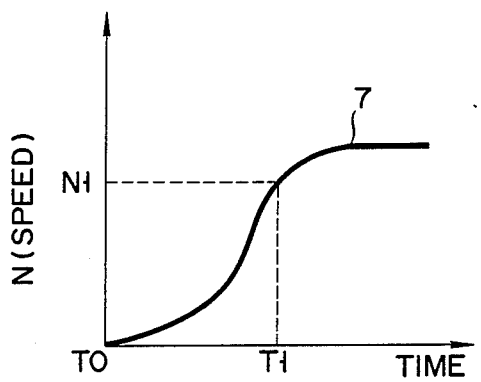
FIG. 3 is a graph showing the induction motor speed as a function of time.

FIG. 3 shows curve 7, which indicates a change in speed N over time when the user puts a load in the washing basket and the motor is driven in the spin drying cycle. Speed N1 in FIG. 3 is equal to predetermined speed N1 in FIG. 2. As shown in FIG. 3, speed N of motor 1 is increased rapidly between time T0 and T1 in order to dry the washing load. After time T1, however, the acceleration of load L0 is gradually decreased, since the washing has been sufficiently dried. As shown in FIG. 2, the increase rate of difference $\theta$ as a function of time decreases with a decrease in motor speed as a function of time in the region above N1. Therefore, the ratio of change of the phase difference as a function of time can be used as a discrimination factor for determining the end of the spin drying, i.e., the load state. The first embodiment is constituted on the basis of the above principle.

The first embodiment of the present invention will be described with reference to FIG. 1. Reference numeral 8 denotes a phase detector (phase detecting means) which constantly detects difference $\theta$ from the start of motor 1 operation while washing is present in the spin drying tank as load L0. Phase detection signal $\theta x$ from detector 8 is supplied to phase comparator 9 and variation ratio comparator (discriminating means) 10. Detector 8 includes an operational amplifier to calculate a time difference between zero-crossing times of the main coil voltage and current. Reference numeral 11 denotes a reference phase device which sets reference phase difference $\theta 1$. When the rated load phase difference is given as $\theta'$, difference $\theta 1$ satisfies that relation $\theta 1/\theta' = 0.9$. Speed N1 described above is obtained at the time of difference $\theta 1$ and represents the time at which the phase difference begins to vary. When comparator 9 determines that the relation $\theta x > \theta 1$ is satisfied, comparator 9 supplies discrimination command signal S1 to comparator 10. Comparator 10 includes an operation amplifier to compare time variation ratio $d\theta x$ of signal $\theta x$ with reference variation rate $d\theta$ (the reference value of the phase difference as a function of time; established by reference variation ratio device 12). When the comparison result satisfies the relation $d\theta x < d\theta$, comparator 10 supplies spinning end signal S2 to motor stop controller (controlling means) 13. In response to signal S2, controller 13 deenergizes motor 1 either immediately or within a predetermined period of time, to compensate for spin drying.

Figure 4:
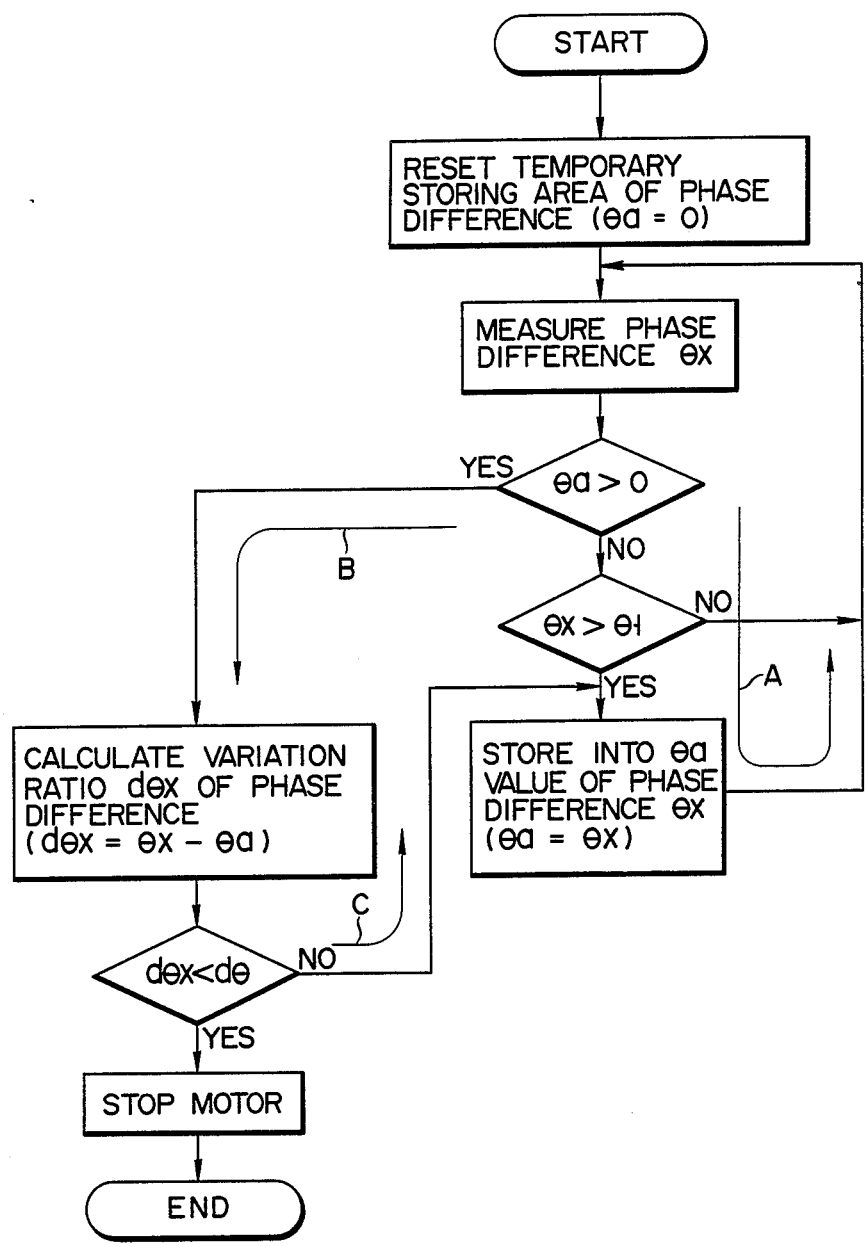
FIG. 4 is a flow chart for explaining the operation of the circuit of FIG. 1 when a microcomputer is used.

The arrangement of the first embodiment can be substituted by a microcomputer, and a program flow chart for such an arrangement is illustrated in FIG. 4. The routine given by arrow A in FIG. 4 is a program routine for sequentially updating content $\theta a$ of the memory for every detection of signal $\theta x$. Routines given by arrows B and C constitute a program routine for calculating the difference between content $\theta a$ (i.e., the previous phase detection signal) and new phase detection signal $\theta x$, and determining the phase difference variation ratio as a function of time in accordance with the calculated difference.

The first embodiment is not limited to the arrangement described above but can be extended, for example, to allow change of spinning speeds if $d\theta$ values can be selectively switched. The phase difference of the auxiliary coil can also be detected.

According to the main part of the first embodiment as described in detail, the phase difference between the coil current and the voltage applied across the induction motor for driving the load and the phase difference variation ratio as a function of time are determined, thereby detecting the load state of the induction motor. Therefore, the apparatus of the first embodiment is free from power source voltage variations and variations in induction motor characteristics, and the load state can be detected with high precision. The spin drying end time is detected by utilizing the fact that the phase difference between voltage and current in the coil of the motor increases in response to an increase in motor speed. At the end of the spin drying, motor speed is at almost maximum speed and is not subjected to further acceleration. This state is detected through determination of the phase difference. Therefore, when the spin drying reaches this stage, the motor is stopped immediately or within a predetermined period of time.

With the operation stop control apparatus for interrupting the spin drying in the washing machine, the end of the spin drying is automatically detected and power to the motor is cut off. The user need not bother with trying to determine spin drying duration. In addition, the spin drying time can be precisely determined, thus eliminating unnecessary spin drying time and decreasing power consumption. Furthermore, the spin drying end is detected using phase difference rather than motor speed variation rate, so higher precision can be obtained.

Second and third embodiments will be described hereinafter. Load state detecting arrangements for the induction motor in these embodiments detect phase differences between coil currents and voltages applied to the induction motor. In this case, the phase difference corresponds to the speed upon a load state variation in the induction motor.

Figure 5:
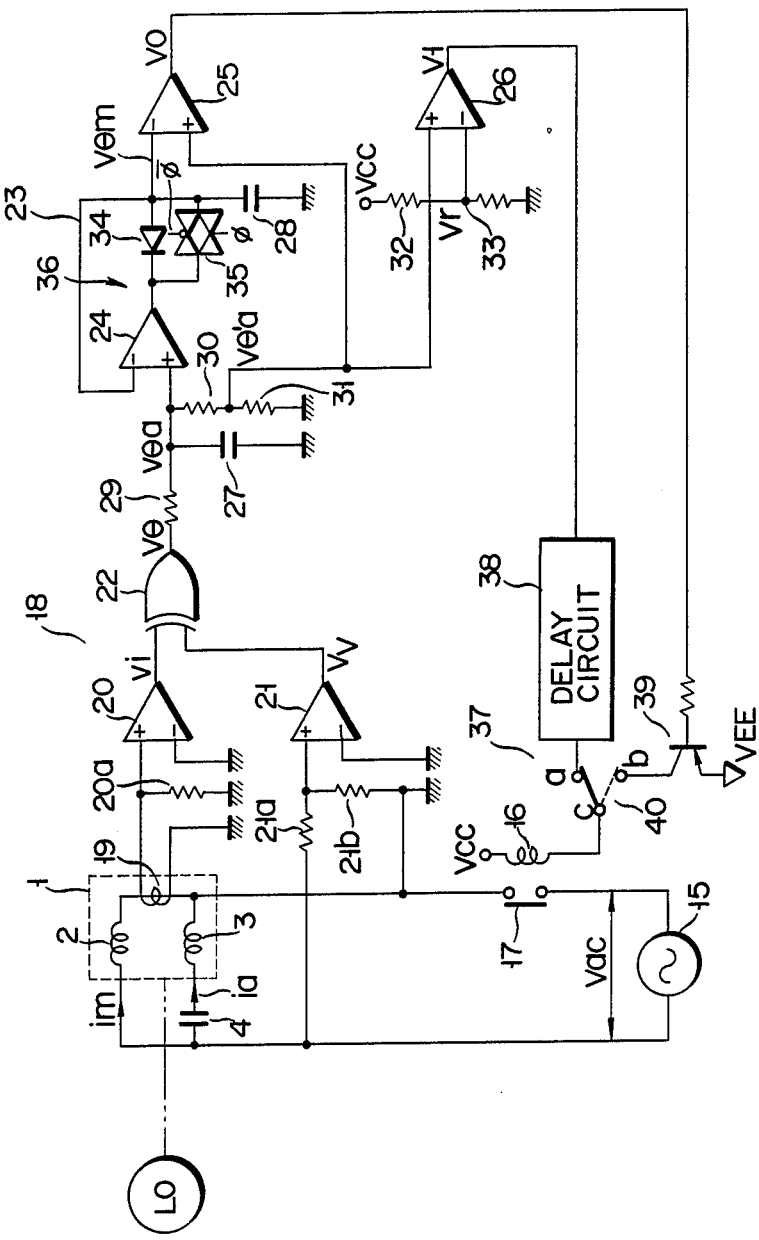
FIG. 5 is a circuit diagram showing a second embodiment of the present invention.
Figure 6:
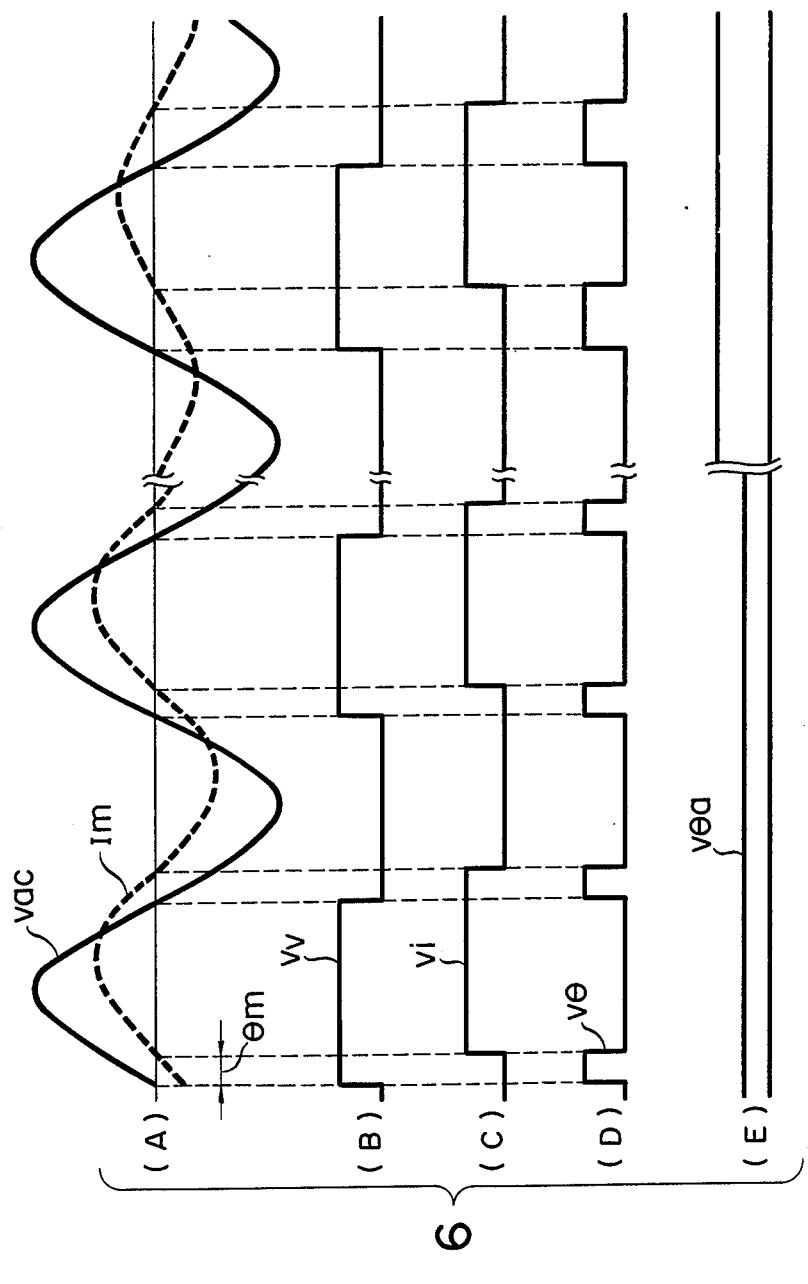
FIGS. 6A to 6E are timing charts showing voltage and current signals of the respective components of the circuit of FIG. 5.

The second embodiment will be described in detail with reference to FIGS. 5 to 10. Referring to FIG. 5, reference numeral 1 denotes an induction motor constituted as a capacitor motor having main coil 2, auxiliary coil 3 and externally connected capacitor 4. In this embodiment, the washing machine has two tanks, a washing basket and a spin drying basket. Motor 1 drives the spin drying basket. Reference numeral 15 denotes a power source for applying a voltage to motor 1 through normally open contact 17. Reference numeral 18 denotes a phase detector having first zero-crossing comparator 20, second zero-crossing comparator 21 and exclusive OR gate 22. Comparator 20 includes current transformer 19 and resistor 20a, and comparator 21 includes resistors 21a and 21b. Reference numeral 23 denotes a speed state discriminator which has operational amplifiers 24, 25 and 26, capacitors 27 and 28, resistors 29 to 33, diode 34 and analog switch 35. Of these elements, operational amplifier 24, capacitor 28, diode 34 and analog switch 35 constitute peak value or minimum value holding circuit 36. Reference numeral 37 denotes a stop controller which has delay circuit 38, switching transistor 39, selection switch 40 for switching the extent of the spin drying, and relay 16. Delay circuit 38 is arranged to give additional spin time. When power is supplied to the washing machine, relay 16 is energized and is then deenergized after a predetermined period of time has elapsed. Selection switch 40 establishes a path between contacts c and a at high spin drying. However, a path between contacts c and b is established at low spin drying.

Figure 8:
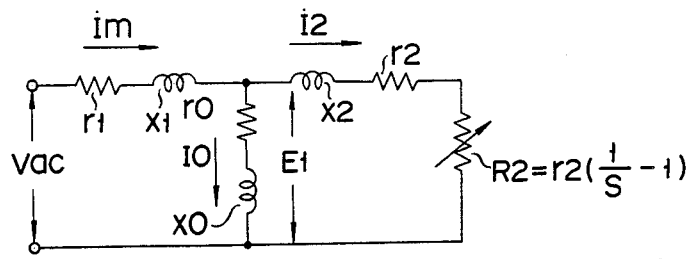
FIG. 8 is a circuit diagram showing an equivalent circuit of the induction motor of FIG. 5.
Figure 9:
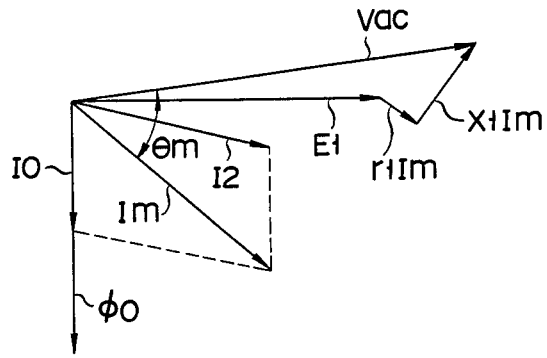
FIG. 9 is a vector chart for the equivalent circuit of FIG. 8.
Figure 10:
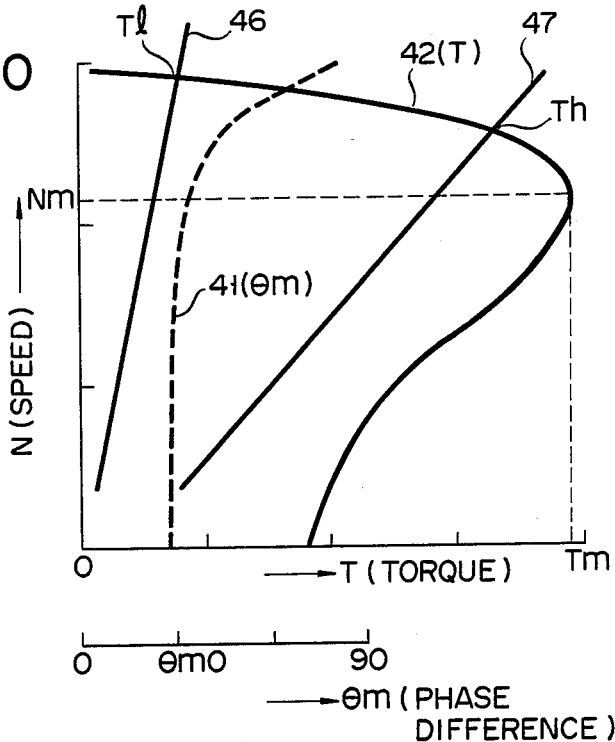
FIG. 10 is a graph showing torque, speed and phase curves for the induction motor of FIG. 5.
Figure 11:
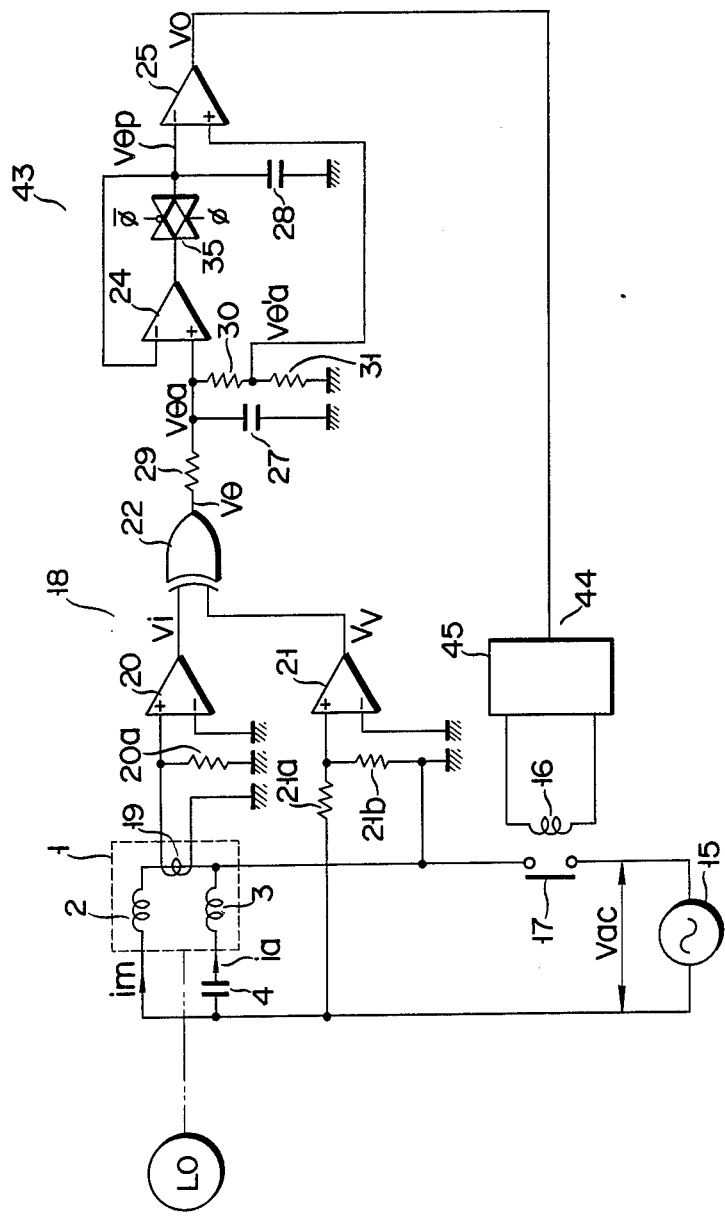
FIG. 11 is a circuit diagram showing a third embodiment of the present invention.

The operation of the arrangement described above will be described below. The relationship between the load magnitude and phase difference $\theta m$ between main coil current Im in the induction motor and power source voltage Vac will be described with reference to FIGS. 8 to 10. FIG. 8 shows an equivalent circuit of motor 1, and FIG. 9 is a vector chart thereof. Referring to FIG. 8, when the speed of motor 1 is increased upon a decrease in load, slippage S is decreased, so that equivalent load resistance R2 ($=r2(1/S-1)$) is increased and secondary load current I2 is decreased. In this case, however, primary excitation current I0 is predetermined. When changes in I2 at the constant I0 are considered with the vector element of FIG. 9, the vector for Im varies. It is thus apparent that $\theta m$ increases with a decrease in I2, i.e., an increase in motor speed. FIG. 10 shows the relationship between difference $\theta m$, speed N and torque T. Referring to FIG. 10, reference numeral 41 denotes a phase curve; and 42, a torque curve. Reference symbol Tm denotes maximum torque; and Nm, speed at maximum torque. It should be noted in FIG. 10 that $\theta m$ is substantially constant when speed N corresponds to a torque smaller than maximum torque Tm, but $\theta m$ typically increases in response to an increase in speed.

The operation of the apparatus shown in FIG. 5 will now be described. Assume that a path is established between contacts c and b in switch 40 and the low spin drying mode is set. When the power source 15 is powered on in this state, transistor 39 is turned on since initial output V0 from amplifier 25 is set at low level. Relay 16 is energized to close contact 17 and supply power source voltage from source 15 to motor 1, thereby driving the spinning basket as load L0. Current Im, shown by a broken line in FIG. 6A, is then detected by transformer 19 and subjected to zero-cross comparison by comparator 20. Current Im is thus converted to pulse voltage Vi shown in FIG. 6C. Similarly, voltage Vac, given by the solid line of FIG. 6A, is subjected to zero-cross comparison by comparator 21 and converted to pulse voltage Vv shown in FIG. 6B. Voltages Vv and Vi are converted by gate 22 to a pulse signal (i.e., phase detection signal $V\theta$) whose duration depends on the magnitude of difference $\theta m$. Signal $V\theta$ charges capacitor 27 through resistor 29 and is thus averaged and converted to analog voltage $V\theta a$ shown in FIG. 6E. Voltage $V\theta a$ is supplied to amplifier 24 in discriminator 23 and is divided by resistors 30 and 31 to derive voltage $V\theta a'$. Switch 35 is temporarily turned on in response to signals $\phi$ and $\bar{\phi}$ upon operation of a control power source (now shown). Therefore, voltage $V\theta a$, corresponding to difference $\theta m0$ (FIG. 10 at the beginning of the rotation of motor 1, is charged as the initial value by capacitor 24 through amplifier 28 irrespective of the presence/absence of diode 34. Switch 35 is turned off. Since diode 34 is present, the voltage at capacitor 28 is corrected only when voltage $V\theta a$ is smaller than the voltage at capacitor 28. The peak value of $V\theta a$, i.e., minimum value $V\theta m$, is always held in capacitor 28.

Voltage $V\theta a'$, the current phase detection signal constantly being updated, is compared with $V\theta m$ by amplifier 25. If the relation $V\theta a' > V\theta m$ (time t1 in FIG. 7A) is satisfied, discrimination signal V0 (FIG. 7B) corresponding to speed Nm is generated. Transistor 39 is turned off in response to signal V0, and relay 16 deenergized. Since contact 17 is open, the motor 1 is deenergized to interrupt the spin drying.

In this case, spin drying rate S0 is low spin drying state S1 suitable for wool clothes.

Figure 7A:
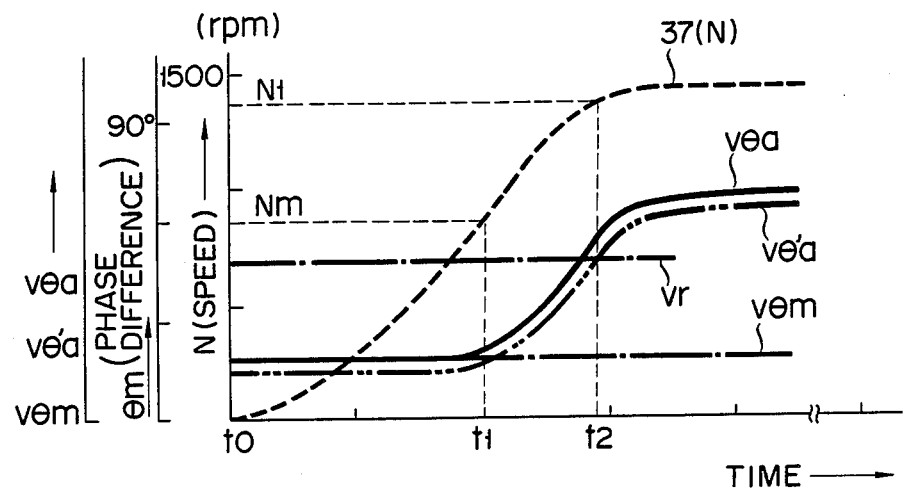
FIGS. 7A to 7C are representations showing the speed of the induction motor of FIG. 5 and its phase detection signal together with the timing chart of the discrimination signal and the spinning or drying rate.
Figure 7B:
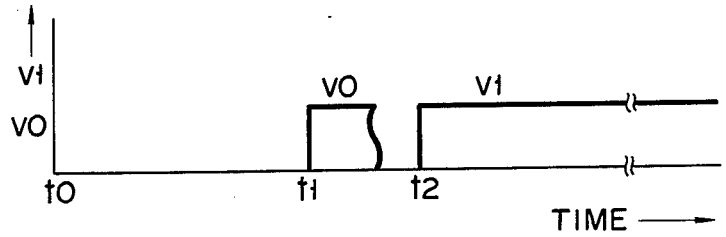
Figure 7C:
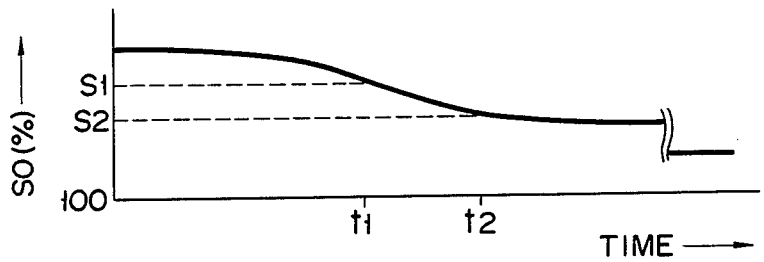

The high spin drying operation will be described wherein a path between contacts c and a in switch 40 is established. In this case, the absolute value of signal $V\theta a'$, is compared by amplifier 26 with strong spinning reference voltage Vr set by resistors 32 and 33. When the comparison result satisfies the relation $V\theta a' > Vr$ (at time t2 in FIG. 7A), amplifier 26 generates discrimination signal V1. Circuit 38 deenergizes relay 16 when a predetermined period of time has elapsed after time t1, and motor 1 is stopped. Speed N1 corresponding to spin drying rate S2 shown in FIG. 7c is discriminated, and spinning operation is terminated within the predetermined period of time.

The third embodiment will be described with reference to FIG. 11 and FIGS. 12A, 12B and 12C. In this embodiment, speed state discriminator 43 is the same as that of FIG. 5 without resistors 32 and 33, diode 34 and operational amplifier 26, and it constitutes a sampling circuit. Stop controller 44 has spin drying timer 45 for defining a spin drying time and relay 16. Upon energization of the power source 15, timer 45 energizes relay 16.

Figure 12A:
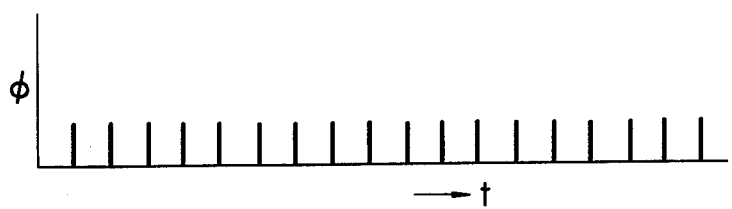
FIG. 12A to 12C are representations showing the time characteristics of the respective signals of FIG. 11 together with the sampling signal and the discrimination signal.
Figure 12B:
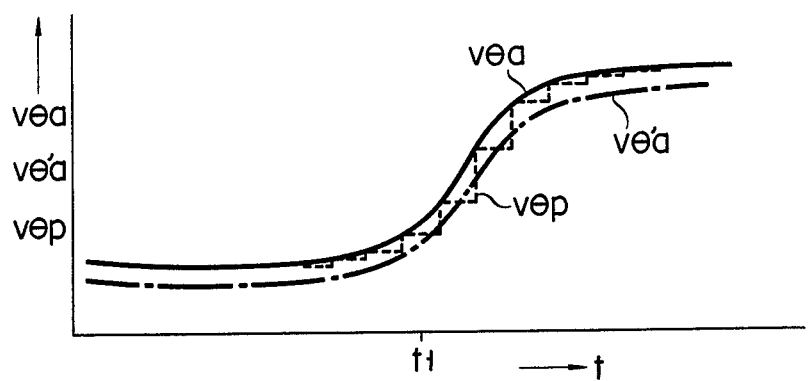
Figure 12C:
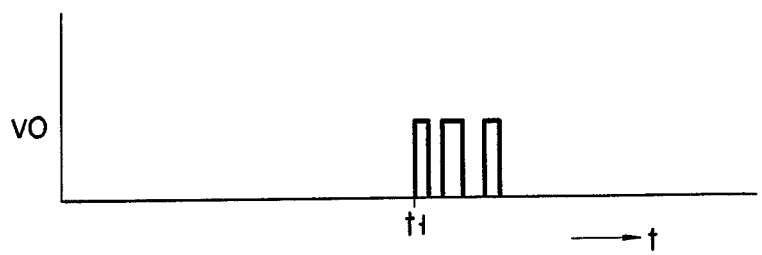

The operation of the third embodiment will be described. Sample signal $\phi(\bar{\phi})$ shown in FIG. 12A is supplied from a sampling generator (not shown) to switch 35 in discriminator 43, i.e., the sampling circuit. Peak value $V\theta p$ at capacitor 28 varies in a stepwise manner, as indicated by the broken line in FIG. 12B. Peak value $V\theta p$ is compared by amplifier 25 with voltage $V\theta a'$. If condition $V\theta p > V\theta a'$ is established, discrimination pulse signal V0 is generated at time t1 (at the time corresponding to maximum torque Tm), as shown in FIG. 12C. Timer 45 is started from time t1. Peak value $V\theta p$ of phase detection signals sequentially stored by signal $\phi$ ($\bar{\phi}$) in capacitor 28 in the sampling circuit serves as a reference value which is compared with new phase detection signal $V\theta a'$. A rapid change in difference $\theta m$ at a crossing of maximum torque Tm can be detected. Signal V0 in the third embodiment corresponds to the variation ratio signal of signal $V\theta a$.

In the apparatuses of the second and third embodiments, the motor speed or constant speed state accompanied by spinning operation of motor 1 for driving spin drying basket as load L0 is detected to stop spin drying.

As is apparent from FIG. 10 according to the apparatuses of the second and third embodiments, in a stable region (i.e., Tl—Th interval of curve 42 defined by curves 46 and 47) where difference $\theta m$ exceeds speed Nm, characteristics greatly vary in response to a slight variation in speed of motor 1. It is thus readily understood that a small variation in rotation in the stable region can be easily detected by the phase detection signal with high precision. Furthermore, difference $\theta m$ does not substantially vary due to variations in power source frequency and its voltage and variations in temperature of the windings. Therefore, high-precision speed detection can be achieved without small errors. The variation ratio of difference $\theta m$ is ±2% for power source variations between 50 Hz and 60 Hz, ±2% for ±10% variation at the power source voltage of 100 V, and ±1% for variations in ambient temperature between 20° C. and 70° C. Variations fall within ±3% for ±10% capacitance variations of capacitor 4 for further reference.

In the second and third embodiments, variations in load state of the induction motor can be accurately detected by the phase detection signal corresponding to the speed. The spin time detected by the apparatus of the second or third embodiment for generating the discrimination signal can be optimal, thereby optimizing the spin drying time.

High-precision discrimination of the motor speed leads to a significant implication that a centrifugal force caused by spinning is proportional to the square of the motor speed.

According to the second and third embodiments as described above, the phase difference between the voltage and the current at the coil in the induction motor is detected. The spinning speed of the basket as the load is detected by the phase detection signal, and the induction motor control and hence stop control are performed, thereby optimizing the spin drying time.

Fourth and fifth embodiments of the present invention will be described hereinafter. In each load state detecting apparatus in the fourth and fifth embodiments, a phase difference between the coil current and the voltage applied to the coil in the induction motor is detected, and a minimum value of the phase detection signal is compared with a new phase detection signal or with a reference sampling value, thereby detecting motor torque, motor speed or their variation ratios and hence detecting the load state.

Figure 13:
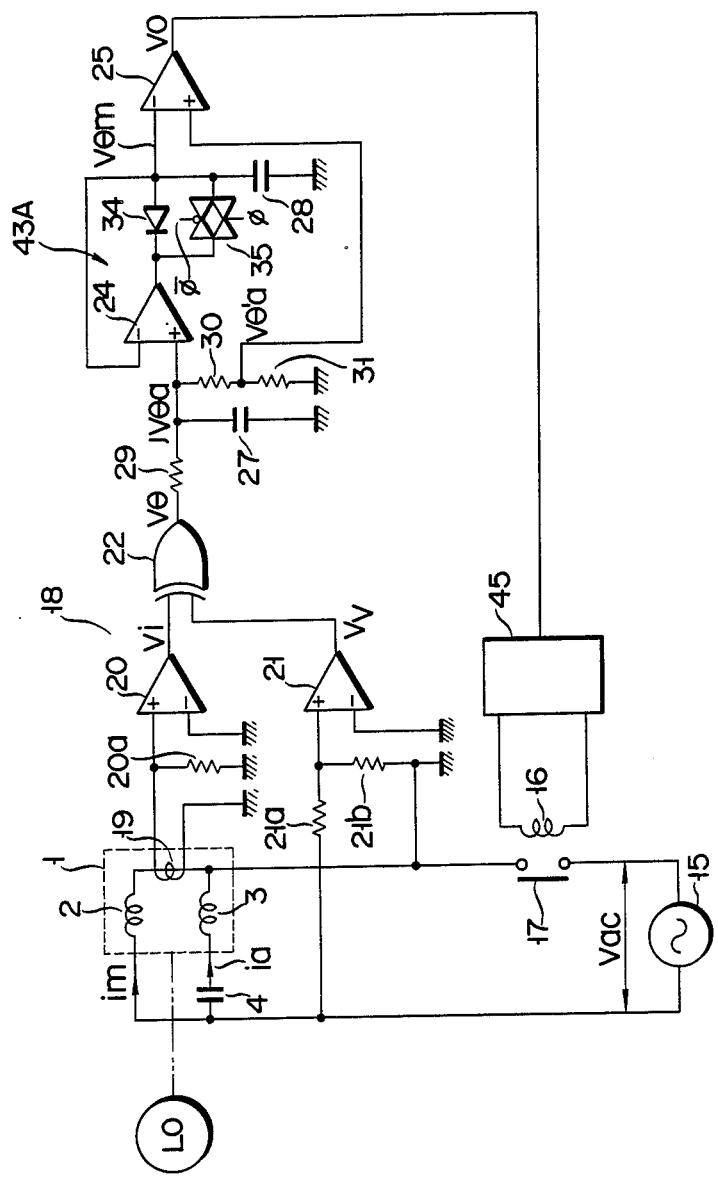
FIG. 13 is a circuit diagram showing a fourth embodiment of the present invention.

FIG. 13 shows the fourth embodiment. The arrangement of the fourth embodiment is substantially the same as that of FIG. 11, except that load state discriminator 43A is constituted by adding diode 34 to speed state discriminator 43 of FIG. 11.

It is readily understood that the description made with reference to FIG. 6 and FIGS. 8 to 10 can be applied to the effect of the fourth embodiment. In this case, discriminator 43 is replaced with discriminator 43A.

Spin drying operation will be described when the main part of the fourth embodiment is applied to spin drying operation control.

Assume that motor 1 is started at time t0 as shown in FIG. 14A. Speed N of motor 1 is gradually increased, as indicated by curve 37, and voltages $V\theta a$ and $V\theta a'$ vary accordingly. As is apparent from the comparison with reference to FIG. 10, the speed is rapidly increased at time t1 when the speed exceeds speed Nm corresponding to maximum torque Tm. Minimum vlaue $V\theta m$ of the phase detection signal is given as phase difference $\theta m$ which does not substantially vary until the speed reaches Nm. When the motor speed exceeds Nm at time t1, difference $\theta m$ is rapidly increased to establish the relation $V\theta a' > V\theta m$, so that the state discrimination signal V0 is generated by amplifier 25 (FIG. 14B). The end of maximum torque Tm is thus detected in accordance with signal V0.

If the spin drying basket as load L0 is continuously spinned at a speed lower than Nm corresponding to maximum torque Tm, this situation may be caused by an unbalanced washing distribution in the basket, When such unbalance occurs in the basket, the basket pivots about its axis and is kept in the unstable region below maximum torque Tm. For this reason, it takes a long period of time to obtain a high-speed region (Nm or more). Meanwhile, spinning does not contribute to drying of clothes due to a low speed.

Once the speed of motor 1 reaches a speed exceeding Nm corresponding to maximum torque Tm, signal V0 is generated by amplifier 25 at time t1. Timer 45 is started after the motor speed exceeds Nm corresponding to maximum torque Tm, thereby spinning clothes sufficiently. The detection of motor speed exceeding Nm corresponding to maximum torque Tm cannot be performed by a method of directly detecting the motor speed. Such detection can be achieved by only phase detection as performed by the present invention.

Figure 15:
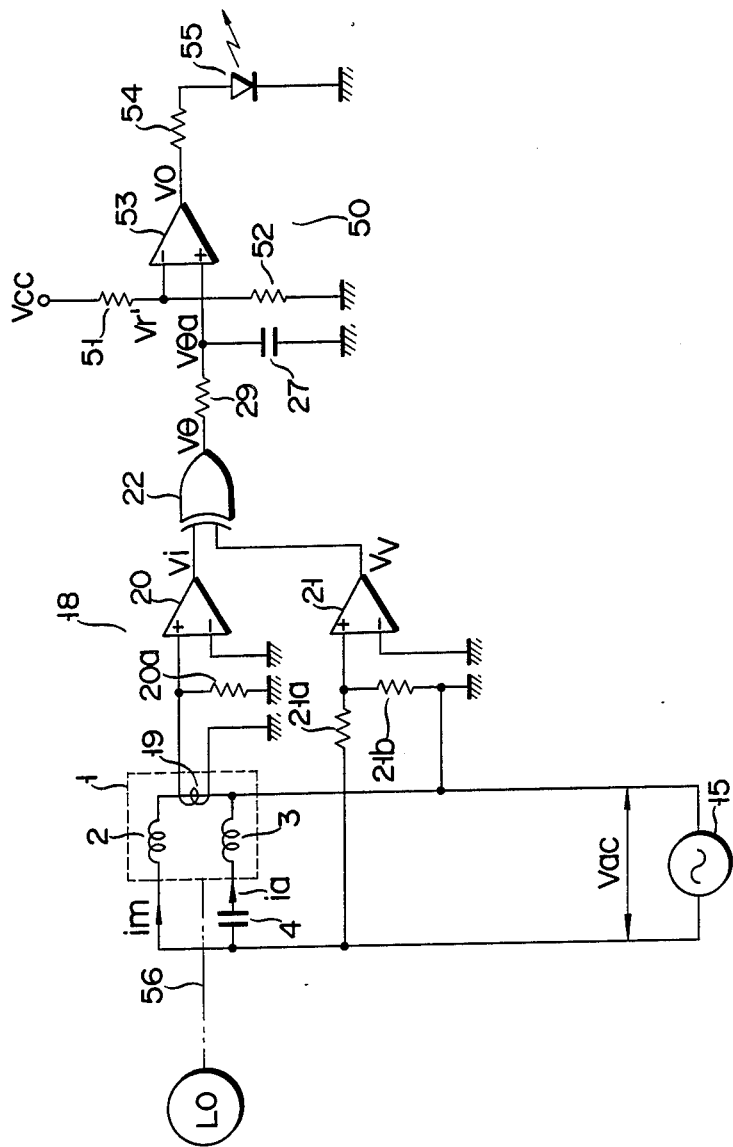
FIG. 15 is a circuit diagram showing a fifth embodiment of the present invention.

A loose belt detecting apparatus which adapts the fifth embodiment of the present invention will be described with reference to FIG. 15. The same reference numerals in FIG. 15 denote the same parts as in the third embodiment of FIG. 5. Referring to FIG. 15, reference numeral 50 denotes a load state discriminator. Discriminator 50 is constituted by operational amplifier 53 for comparing the reference value Vr' set by resistors 51 and 52 with phase detection signal $V\theta a$ as a terminal voltage or an analog voltage at the same capacitor as in FIG. 5. An output from amplifier 53 is supplied to an indicator such as light-emitting diode 55 through resistor 54.

Assume that motor 1 is diriving load L0 through belt 56. Also assume that a load torque is given as T1 (FIG. 10) When belt 56 is normally looped without slippage, an output torque of motor 1 is also given as T1. However, when the belt is loosened, the load torque of motor 1 is decreased from T1 to T0. A torque change increases difference $\theta m$. Accordingly, when phase detection signal $V\theta a$ in FIG. 15 is increased and exceeds reference value Vr' preset including normal load T1 variations, signal V0 is generated by amplifier 53, thereby driving diode 55 and hence alerting belt looseness.

The fifth embodiment described above typically represents the main feature of the present invention. As shown in FIG. 10, the load operation of the induction motor is normally started in the Th-Tl region, i.e., the stable region where the motor speed exceeds Nm corresponding to maximum torque Tm. In the stable region (the motor speed is Nm or more), the torque is greatly changed but the motor speed variation ratio is small. Under these conditions, it is very difficult to directly detect loosening of the belt upon conventional direct detection of the motor speed. However, phase detection in the fifth embodiment can directly detect loosening of the belt. This can be true in detection at time t1 where the torque is maximum torque Tm. It is almost impossible to detect time t1 in accordance with the conventional motor speed detection technique.

Fourth and fifth embodiments allow load state detection with high precision in the same manner as in the second and third embodiments.

Thus, according to the present invention as described in detail, there is provided a load state detection apparatus of an induction motor which allows high-precision detection of a signal depending on torque variations and motor speed variations in the stable region of the induction motor in accordance with the phase difference between the induction motor coil current and the voltage applied to the induction motor.

The present invention is not limited to the exemplified embodiments described above. Various changes and modifications may be made within the spirit and scope of the invention.

What is claimed is:

1. An apparatus for controlling a spin drying means which is driven by an induction motor having two coils which are supplied with a drive voltage, said apparatus comprising:

phase difference detecting means for detecting a phase difference between the drive voltage supplied to the coils of said induction motor and a current flowing through the coils upon application of the drive voltage, and outputting a phase difference signal;

averaging means for averaging the magnitude of the phase difference signal supplied thereto from said phase difference detecting means;

dividing means for dividing an averaged phase difference signal from said averaging means and outputting a current value of the averaged phase difference signal;

holding means for holding one of an initial value and a minimum level smaller than the initial value of the averaged phase difference signal from said averaging means and outputting a first reference value corresponding to low speed spin drying;

first comparing means for comparing the current value from said dividing means and the first reference value from said holding means and obtaining a low spin drying termination detecting output of said spin drying means when the current value from said dividing means is greater than said first reference value;

reference value outputting means for outputting a second reference value having a level higher than the first reference value and corresponding to high speed spin drying;

second comparing means for comparing the current value from said dividing means and the second reference value from said reference value outputting means and obtaining a high spin drying termination detecting output of said spin drying means when the current value from said dividing means is greater than said second reference value;

switching means for selectively switching between the low and high spin drying termination detecting outputs from said first and second comparing means; and control means for cutting off the drive voltage supplied to said coils to terminate said induction motor in accordance with the output from said switching means.

2. An apparatus according to claim 1, wherein said phase difference detecting means includes means for generating a phase difference detection output by detecting a difference between zero-crossing timings of the drive voltage and the coil current.

3. An apparatus according to claim 1, wherein said control means includes means for interrupting said induction motor when a predetermined period of time has elapsed.

4. An apparatus according to claim 1 wherein said control means includes means for interrupting the drive voltage after performing a predetermined processing upon receipt of the low or high spin drying termination outputs.

5. An apparatus according to claim 4, wherein said predetermined processing is a short spin drying cycle.

6. An apparatus according to claim 1, further comprising an alarm responsive to the output of said switching means for generating an alarm when either said low or high spin drying termination outputs is present.

7. An apparatus according to claim 6, wherein said alarm comprises a display.

8. An apparatus according to claim 1, wherein said control means includes a timer, which is used for a drying operation is accordance with results of the comparison performed by said first and second comparing means, and means for stopping the supply of the drive voltage to the coils of said induction motor on the basis of an output of said timer.

* * * * *